United States Patent [19]

West

[11] Patent Number: 4,747,065
[45] Date of Patent: May 24, 1988

[54] AUTOMATIC GAIN CONTROL IN A DIGITAL SIGNAL PROCESSOR

[75] Inventor: Lynn P. West, Austin, Tex.

[73] Assignee: International Business Machines Corporation, Armonk, N.Y.

[21] Appl. No.: 786,911

[22] Filed: Oct. 11, 1985

[51] Int. Cl.⁴ .................. G06F 7/38; H04L 27/08
[52] U.S. Cl. ...................... 364/715; 375/98
[58] Field of Search .............. 330/129, 138, 279, 280; 375/98; 455/245; 364/157, 715, 736, 724

[56] References Cited

U.S. PATENT DOCUMENTS

| | | | |
|---|---|---|---|
| 3,562,504 | 2/1971 | Harris | 235/310 |
| 3,969,683 | 7/1976 | Fabricius | 330/129 |
| 3,996,519 | 12/1976 | Wagner | 340/353 |
| 4,191,995 | 3/1980 | Farrow | 364/113 |
| 4,213,097 | 7/1980 | Chiu et al. | 330/129 |
| 4,282,581 | 8/1981 | Bondurant et al. | 364/715 |
| 4,464,723 | 8/1984 | Chartier | 375/98 |
| 4,477,698 | 10/1984 | Szlam et al. | 179/90 |
| 4,499,586 | 2/1985 | Cafarella et al. | 375/98 |
| 4,551,688 | 11/1985 | Craiglow | 330/280 |
| 4,553,104 | 11/1985 | Olsen | 330/129 |
| 4,554,511 | 11/1985 | Braun | 330/129 |
| 4,623,934 | 11/1986 | Taylor | 375/98 |
| 4,677,389 | 6/1987 | Op de Beek et al. | 330/129 |

Primary Examiner—Gary V. Harkcom
Assistant Examiner—Dale M. Shaw
Attorney, Agent, or Firm—J. F. Villella, Jr.; H. St. Julian

[57] ABSTRACT

Automatic gain control (AGC) is provided in a digital signal processor environment. A predetermined threshold value, a predetermined automatic gain control value, and a predetermined count threshold value are established and stored in a data memory associated with a signal processor. Each incoming signal sample that is received is multiplied by the AGC value with the product being temporarily stored in the data memory. The absolute value of the resulting product is taken and added to the predetermined threshold value. If the result of this operation results in a signal processor overflow, then the AGC value is reduced and stored back into the data memory. The adjustment period of the AGC value is chosen to be well under the allowable distortion time for speech, dual tone multi-frequency reception, and modem operation.

19 Claims, 3 Drawing Sheets

AUTOMATIC GAIN CONTROL IN A DIGITAL SIGNAL PROCESSOR

TECHNICAL FIELD

This invention relates generally to automatic gain control, and more particularly, to automatic gain control in a digital signal processor.

BACKGROUND ART

The automatic adjustment of the gain of an incoming electrical or acoustical signal prior to further signal processing is known in the prior art. Typically, automatic gain control (AGC) mechanisms are implemented in hardware using non-linear devices, such as diodes, to compand the incoming signal. In digital signal processing, such non-linear devices are unavailable. Normally, a digital signal processor accomplishes AGC by performing arithmetic division. A drawback with the use of arithmetic division is that it requires significant amounts of the processing capability of the digital signal processor.

AGC mechanisms are normally used in devices which receive amplitude varying signals. The following are examples of such amplitude varying signals: speech from a microphone wherein the distance between the microphone and the speaker changes or where individual speakers talk at varying amplitudes; modem signals from a telephone line, since the amplitude attenuation of any one telephone line may be different from other telephone lines; and, speech from a telephone line wherein the sources of variation may be due to both the speaker and the varying telephone line. Automatic gain control mechanisms are helpful to limit the dynamic range over which most of the most complex portion of the signal processing must work, i.e., to prevent amplifiers from saturating from high level signals while at the same time minimizing the effects of thermal noise introduced by circuitry.

As mentioned previously, the non-linear effects commonly employed in hardware implementations are not available in a digital signal processor. An AGC process in such a processor uses division. Typically, the input signal level, which is usually the largest sample over a period of time, is determined, and then arithmetic inversion is performed. All subsequent incoming samples over a period of time are then multiplied by this inverted value. Consequently, large incoming signals are multiplied by a small AGC value, and small incoming signals are multiplied by a large AGC value. A problem with current signal processors is that division is performed rather inefficiently. As a result, large amounts of the processing power of a digital signal processor is employed just for automatic gain control. In a telephony environment, this leaves critical functions such as dual tone multi-frequency detection demodulation, call progress, and telephone line monitor, with reduced processing capability.

U.S. Pat. No. 4,191,995 shows a typical digital AGC circuit implemented in hardware. The circuit includes both an analog attenuator and a digital attenuator for applying controlled attenuation to the input analog signal and the digital representation of said input signal, respectively. The analog and digital attenuators operate under control of a digital control circuit. U.S. Pat. No. 3,996,519 also discloses a digital signal processor having automatic gain control implemented in hardware. The processor disclosed therein utilizes two parity generators, a set-reset flip-flop shift register and logic to control the output of a serially connected shift register.

U.S. Pat. No. 4,499,586 describes a microprocessor controlled automatic gain control used in a receiver for receiving recurring first and second scanning signals. The apparatus includes a linear and a logarithmic amplifier. Means are provided for generating a digital gain control signal in response to a peak magnitude signal with a D/A convertor for converting digital gain control signals into analog gain control signals which are then applied to the gain control input of a linear amplifier.

U.S. Pat. No. 4,477,698 discloses an apparatus for detecting pickup at a remote telephone set. The apparatus uses a high gain band pass filter with no automatic gain control employed. Although the apparatus is able to detect telephone call pickup, it is unable to compensate for different speech levels and/or modem signal levels which would require automatic gain control.

DISCLOSURE OF THE INVENTION

Accordingly, it is an object of this invention to provide improved automatic gain control in a digital signal processor.

It is another object of this invention to provide automatic gain control in a digital signal processor without the use of non-linear hardware devices.

In accordance with these and other objects of the invention, automatic gain control is provided in a digital signal processing environment to provide automatic gain control (AGC) in speech, telephony, and modem applications. According to the present invention, a predetermined threshold value is established and stored in a memory location in the data storage associated with signal processor. A predetermined automatic gain control (AGC) value as well as a predetermined count threshold value is established and also stored in the data storage. Each incoming signal sample that is received is multiplied by the AGC value, with the product being temporarily stored at another location within the data storage of the signal processor. The absolute value of the resulting product is taken and added to the predetermined threshold value. If the result of this operation results in a signal processor overflow, then the AGC value is reduced (multiplied by a positive fraction less than one) and stored back into the memory location in which the predetermined AGC value has been stored. If a predetermined number of consecutive samples causes an overflow, then the AGC value is reduced within a set time period. This time period is chosen to be well under the allowable distortion time for speech, dual tone multiple frequency (DTMF) reception, and modem operation.

BEST MODE FOR CARRYING OUT THE INVENTION

Figure 1:
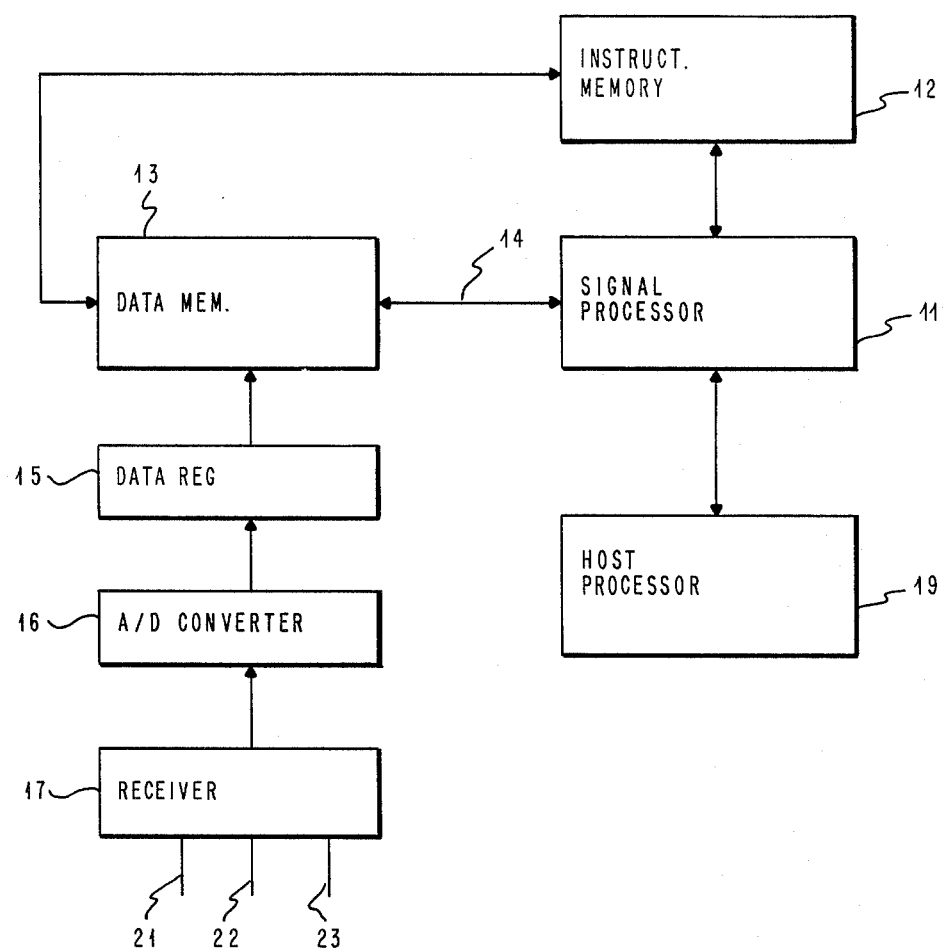
FIG. 1 is a functional block diagram of the system according to the present invention.

A simplified functional block diagram is shown in FIG. 1. Signal processor 11 may be any commercially available signal processor such as the Texas Instruments TMS32010. Signal processor 11 is totally controlled by host processor 19 and must have its central processing unit (CPU) instructions loaded before operation. Signal processor 11 uses instruction memory 12 as well as data memory 13. Both of these memories, i.e., instruction memory 12 and data memory 13 are accessible by host processor 19 although not at the same time as signal procesor 11. Instruction memory 12 is accessible by host processor 19 only when signal processor 11 is turned off, i.e., reset. At that time, host processor 19 can load from instruction memory 12 and then switch to data memory 13 which is shared at all times dynamically with signal processor 11. Both signal processor 11 and host processor 19 have the capability to interrupt one another with interrupt masking under control of host processor 19.

Speech and/or audio signals are input over lines 21, 22, and 23 to receiver 17. These signals, which have amplitude variations, may be speech from either a microphone or telephone as well as speech from a telephone line, or they may be modem signals from a telephone line. These incoming signals, which are in analog format, are converted to digital by A/D converter 16 and temporarily stored in data register 15. These digitized signals are then input to data memory 13. A/D converter 16 provides digitized samples of the analog signals input over lines 21, 22, and 23. It is these digitized samples which are stored in data memory 13 and which are amplitude adjusted, thereby providing automatic gain control using signal processor 11.

The automatic gain control (AGC) of the signals stored in data memory 13 is performed by signal processor 11 in conjunction with data memory 13 using bus 14. In addition to the storage of the digitized input samples in data memory 13, other predetermined values which are used to perform the automatic gain control of such digitized input signals are stored in data memory 13. These predetermined values include: a threshold value (THVAL); a predetermined AGC value (AGCVAL); and, a predetermined count threshold (UPCNT). Additionally, during the AGC processing of the digitized samples in data memory 13 by signal processor 11, further values are generated which are then stored in data memory 13. This will be explained in more detail hereinafter.

Figure 2:
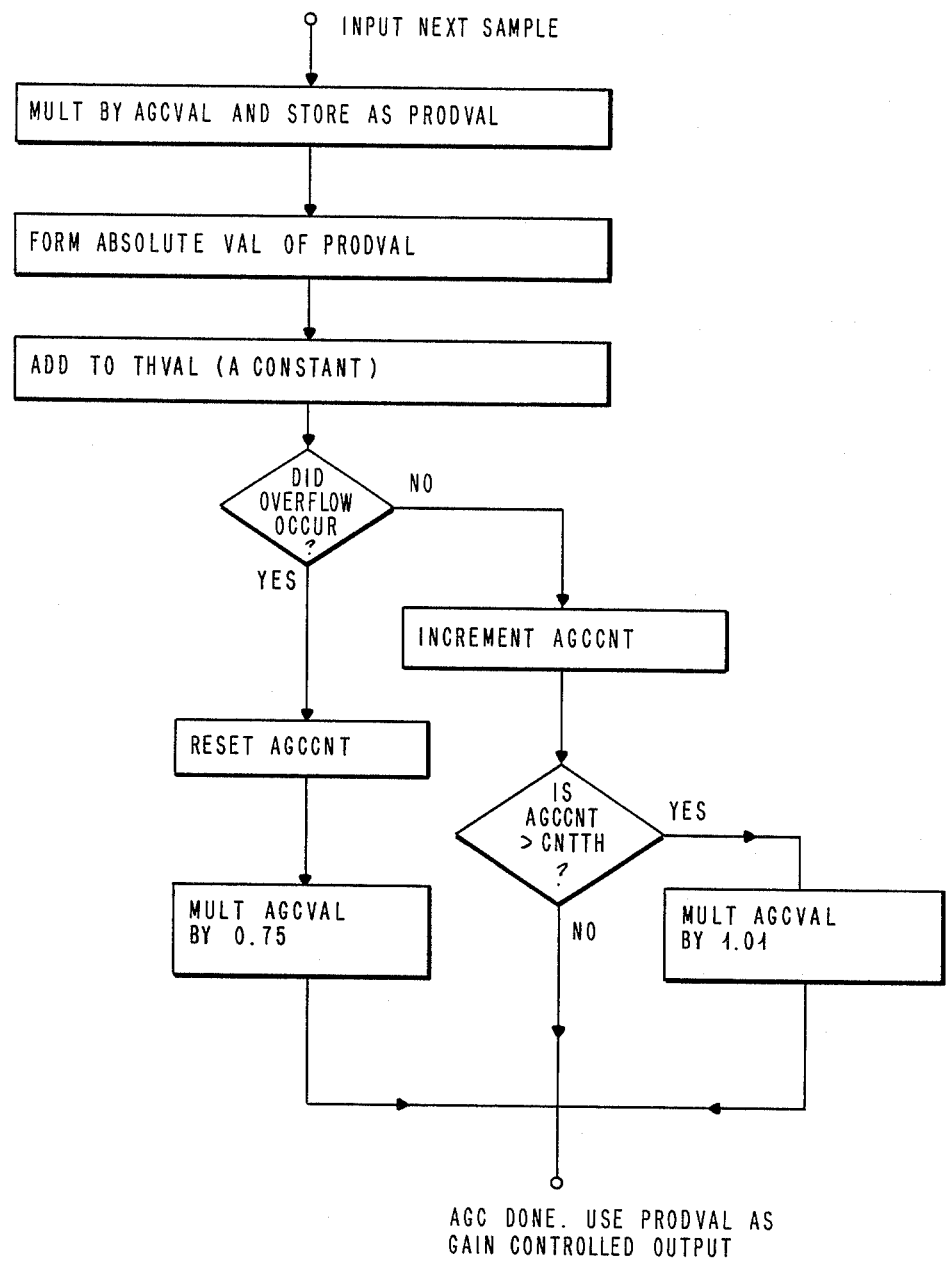
FIG. 2 is a flow charge depicting the operation of the preferred embodiment of the present invention.

The automatic gain control of the digitized samples stored in data memory 13 will now be explained in more detail with reference to FIG. 2. The predetermined threshold and count-threshold values, AGCVAL and UPCNT, respectively, are input from data memory 13 over bus 14 to signal processor 11. The digitized samples are also input over bus 14 from data memory 13 to signal processor 11. Each digitized sample input over bus 14 is multiplied in signal processor 11 by the AGC value which had previously been stored in data memory 13. The product value is then temporarily stored in data memory 13 as PRODVAL. The absolute value of the product just formed is then taken and added to the predetermined threshold value, THVAL, which had been stored in data memory 13. If the result of this summation is an overflow, then the original AGC value is multiplied by 0.75 and stored back into data memory 13. Additionally, when an AGC overflow occurs, a count, known as the AGC count, is reset to 0.

When an overflow condition does not occur, i.e., the sum of PRODVAL and THVAL does not cause overflow, then the AGC count value is incremented. When a significant number of digitized samples are input to signal processor 11 which do not cause the threshold value to overflow, then the AGC count value, which is incremented each time, can become quite large. Accordingly, for each digitized sample that does not cause an overflow condition, the AGC count value is compared with the predetermined count threshold value, UPCNT, which had been stored previously in data memory 13. When the AGC count value exceeds the original count threshold value, then the AGC value is multiplied by 1.01. For each succeeding inputted sample time that the output threshold does not overflow, the AGC value is once again multiplied by 1.01.

The adjustment of the AGC value in the AGC count is done at a rate to insure that there is an allowable amount of distortion in the incoming signal upon which the automatic gain control is performed. For speech, the allowable distortion time is on the order of 15 milliseconds while for dual tone multi-frequency tones, the allowable distortion time is about 5 milliseconds. The allowable distortion time for modems is considerably longer than that for speech. Having assured that the AGC value is changed rapidly enough to prevent distortion, the gain controlled output is then taken to be the product value that results by multiplying the AGC value by the digitized sample that is input to signal processor 11 over bus 14 from data memory 13.

Figure 3:
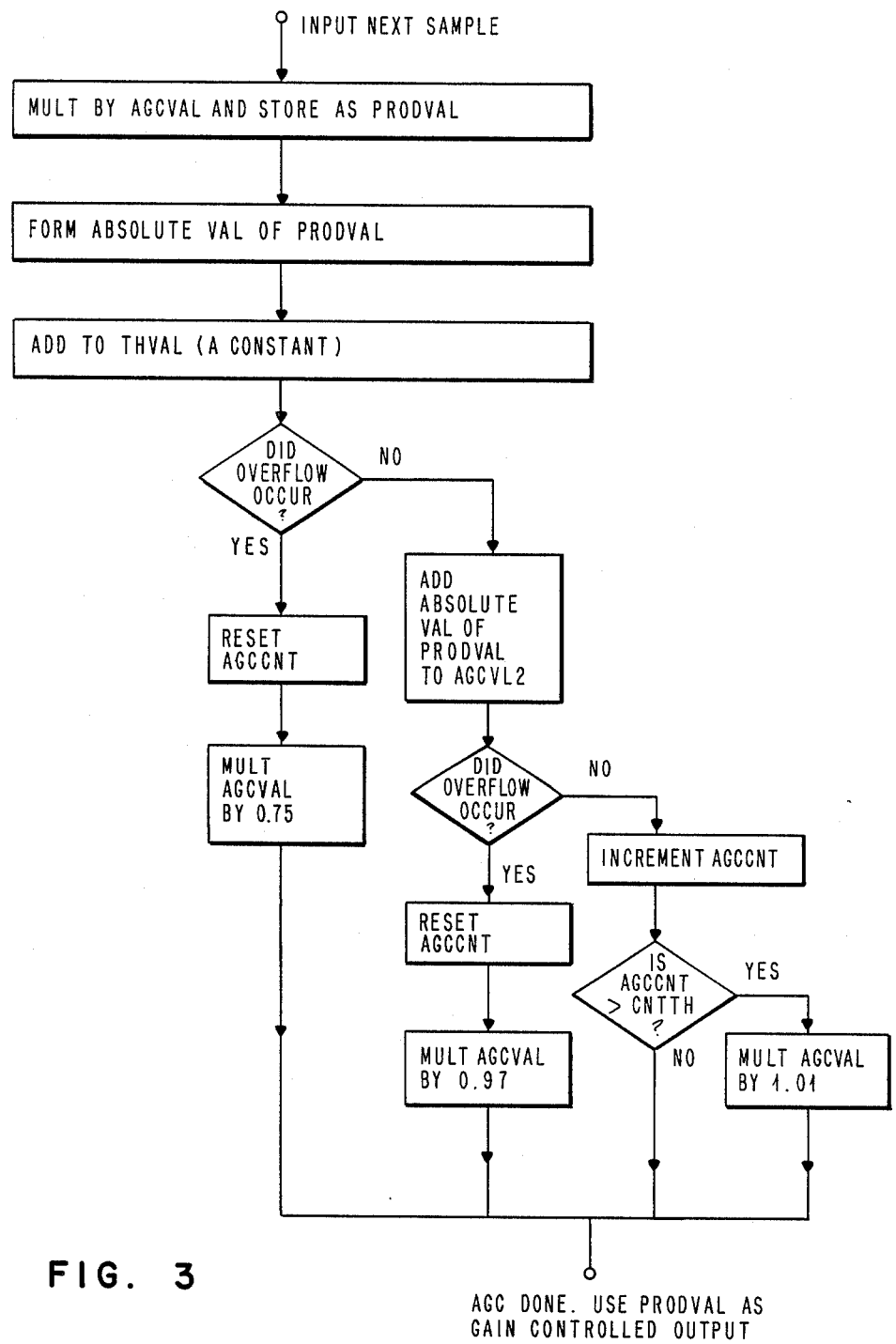
FIG. 3 is a flow chart depicting an alternative embodiment according to the present invention.

An alternative method of performing automatic gain control on the digitized samples stored in data memory 13 will now be described in more detail with reference to FIG. 3. This alternative method of AGC differs from that previously described in that there are two predetermined threshold values which are stored in data memory 13, threshold value 1 and threshold value 2. Threshold value 1 is greater than threshold value 2, thereby providing a lower threshold than value 2 would provide. Using this alternative method, after the AGC value has dropped to a level where the threshold value 2 no longer causes overflows, but where threshold value 1 still does cause overflows, the amount of reduction in the AGC value at overflow is decreased. This is seen by the additional branch existing in the flow chart depicting this alternative embodiment as opposed to the preferred embodiment depicted in FIG. 2. As can be seen, the "no" branch after the first overflow decision provides that the absolute value of the product value is added to a second value for the AGC. At this point, an additional decision is made as to whether or not an overflow occurred. If the overflow occurred once again, then the AGC count is reset and the AGC value is multiplied by 0.97 instead of the previously used 0.75. The "no" branch following this second overflow decision path is identical to the "no" path shown for the preferred embodiment. That is, the AGC count is incremented and then a decision is made as to whether or not the AGC count is greater than the count threshold which had previously been stored in data memory 13. If the AGC count does, at this point, exceed the count threshold, then the AGC value is multiplied by 1.01. Once again, after the AGC has been performed on the digitized input sample, the product value is taken as the gain controlled output of the system.

As an example of the operation of the alternative method, assume that the initial AGC value is 1,000. Assume also that 4 out of the first 23 digitized samples cause the second threshold value to be exceeded. The AGC value will then be multiplied by 0.75 four times by the time the 23rd digitized sample is reached. At that point, the AGC value is approximately 316. Assume further that 7 out of the next 15 samples cause the first threshold value to be exceeded but do not exceed the second threshold value. If the multiplier associated with the first threshold value is 0.97 as shown in FIG. 3, then after these 15 samples, the AGC value will be 255. This iterative process allows very quick adjustment of the AGC value to the correct range.

In another alternative embodiment based upon the preferred embodiment, a plurality of threshold values and a plurality of count threshold values are used. In this alternative embodiment, the highest valued of the plurality of predetermined threshold values is compared to the sum of the product term and the predetermined automatic gain control value. If the highest value of the plurality of predetermined threshold values is exceeded by the sum of the product term and the predetermined automatic gain control value, then the automatic gain control value is reduced. Similarly, a plurality of count threshold values is established and the lowest valued of the plurality of count threshold values is compared to the automatic gain control count value. If the automatic gain control count value exceeds the lowest valued of the plurality of count threshold values, then the automatic gain control value is multiplied by a number greater than 1.

While the invention has been particularly shown and described with reference to a preferred and an alternative embodiment thereof, it will be understood by those skilled in the art that the foregoing and other changes in form and detail will be made therein without departing from the spirit and scope of the invention. Specifically, multiple threshold values may be used in the alternative embodiment to enable increased precision on the automatic gain control adjustments. Further, the up multiplier may be made a function of the threshold range within which the AGC value is operating.

I claim:

1. A method of providing automatic gain control of input signals in a signal processor, said method comprising the steps of:
   multiplying a sample of an input signal by a predetermined automatic gain control signal to form a product term;
   adding a predetermined threshold value to an absolute value of said product term;
   determining whether said addition of said absolute value of said product term and said predetermined threshold value created an overflow condition; and
   reducing said predetermined automatic gain control signal in response to said overflow condition.

2. The method as recited in claim 1 wherein said step of reducing comprises the step of multiplying said predetermined automatic gain control value by a constant having a value less than a value of one.

3. The method as recited in claim 2 further comprises the step of establishing a count threshold value.

4. The method as recited in claim 3 further comprises the steps of:
   establishing an automatic gain control count value;
   resetting said automatic gain control count value to a value of zero subsequent to said overflow condition; and
   incrementing said automatic gain control count value in the absence of said overflow condition occurring.

5. The method as recited in claim 4 further comprises the steps of:
   comparing said automatic gain control count value to said count threshold; and
   increasing said automatic gain control value in response to said automatic gain control count value exceeding said count threshold value.

6. The method as recited in claim 1 further comprising the step of establishing a plurality of predetermined threshold values whereby a first predetermined threshold value is greater than a second predetermined threshold value.

7. The method as recited in claim 6 and wherein the step of adding said predetermined threshold value includes the step of adding said second predetermined threshold value to said product term.

8. The method as recited in claim 7 wherein said overlfow condition is a first overflow condition and further includes the steps of:
   determining whether said addition of said absolute value of said product term and said second predetermined threshold value created said first overflow condition; and
   adding said absolute value of said product term to said first predetermined threshold value if said overflow condition was created.

9. The method as recited in claim 8 further includes the steps of:
   determining whether said addition of said absolute value of said product term and said first predetermined threshold value created a second overflow condition; and
   reducing said predetermined automatic gain control signal in response to said second overflow condition.

10. The method as recited in claim 9 further comprises the step of establishing a count threshold value.

11. The method as recited in claim 10 further comprises the steps of:
    establishing an automatic gain control count value;
    resetting said automatic gain control count value to a value of zero subsequent to the occurrence of said first overflow condition or said second overflow condition; and
    incrementing said automatic gain control count value in the absence of said second oveflow condition occurring.

12. The method as recited in claim 11 further comprises the steps of:
    comparing said automatic gain control count value to said count threshold; and
    increasing said automatic gain control value in response to said automatic gain control count value exceeding said count threshold value.

13. An apparatus for providing automatic gain control of input signals in a signal processor, comprising:
    means for multiplying a sample of an input signal by a predetermined automatic gain control signal to form a product term;
    means for adding a predetermined threshold value to an absolute value of said product term;
    means for determining whether said addition of said absolute value of said product term and said predetermined threshold value created an overflow condition; and
    means for reducing said predetermined automatic gain control signal in response to said overflow condition.

14. The apparatus as recited in claim 13 further comprises means for establishing a plurality of predetermined threshold values whereby a first predetermined threshold value is greater than a second predetermined threshold value.

15. The apparatus as recited in claim 13 wherein said reducing means comprises means for multiplying said predetermined automatic gain control value by a constant having a value less than a value of one.

16. The apparatus as recited in claim 15 further comprises means for establishing a count threshold value.

17. The apparatus as recited in claim 16 further comprises:
   means for establishing an automatic gain control count value;
   means for resetting said automatic gain control count value to a value of zero subsequent to said overflow condition; and
   means for incrementing said automatic gain control count value in the absence of said overflow condition occurring.

18. The apparatus as recited in claim 17 further comprises:
   means for comparing said automatic gain control count value to said count threshold; and
   means for increasing said automatic gain control value in response to said automatic gain control count value exceeding said count threshold value.

19. An apparatus for providing automatic gain control of input signals, comprises:
   means for establishing a predetermined automatic gain control value;
   means for establishing a predetermined threshold value;
   means for receiving a sample of an input signal and multiplying said sample by said predetermined automatic gain control value, thereby generating a product term;
   means for forming an absolute value of said product term;
   means for adding said absolute value of said product term to said predetermined threshold value;
   means for determining whether said sum of said absolute value of said product term and said predetermined threshold value resulted in an overflow condition; and
   means for reducing said automatic gain control value in response to said overflow condition.

* * * * *